United States Patent
Buffet et al.

(10) Patent No.: US 6,924,661 B2
(45) Date of Patent: Aug. 2, 2005

(54) POWER SWITCH CIRCUIT SIZING TECHNIQUE

(75) Inventors: Patrick H. Buffet, Essex Junction, VT (US); John M. Cohn, Richmond, VT (US); Kevin M. Grosselfinger, South Burlington, VT (US); Susan K. Lichtensteiger, Essex Junction, VT (US); William F. Smith, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/248,696

(22) Filed: Feb. 10, 2003

(65) Prior Publication Data

US 2004/0155681 A1 Aug. 12, 2004

(51) Int. Cl.⁷ ............................................. H03K 19/173
(52) U.S. Cl. ............................. 326/38; 326/41; 326/82; 257/691
(58) Field of Search ............................ 326/37–41, 82, 326/83; 257/207, 691

(56) References Cited

U.S. PATENT DOCUMENTS

| | | |
|---|---|---|
| 5,311,058 A | 5/1994 | Smolley |
| 5,668,389 A | 9/1997 | Jassowski et al. |
| 5,923,089 A | 7/1999 | Yao et al. |
| 6,091,090 A | 7/2000 | Gheewala |
| 6,111,804 A | 8/2000 | Borkar |
| 6,115,279 A | 9/2000 | Kitsukawa et al. |
| 6,396,137 B1 * | 5/2002 | Klughart ..................... 257/691 |

OTHER PUBLICATIONS

IBM Technical Disclosure Bulletin, "Power and Ground Bus Structure on Integrated Circuit for Circuit Compression", Nov. 1983, pp. 2840–2841.

* cited by examiner

*Primary Examiner*—Don Le
(74) *Attorney, Agent, or Firm*—McGinn & Gibb, PLLC; Richard M. Kotulak, Esq.

(57) ABSTRACT

An integrated circuit structure has at least one voltage island and a pattern of power switches within the voltage island. The pattern determines the number of (and evenly spaces) the power switches according to the size of the serviceable area to which each of the power switches can provide power. The size of the power switches are matched to the current and voltage that will be provided by the power buses. The size of the serviceable area to which each of the power switches can provide power is dependent upon the size of the power switches.

36 Claims, 8 Drawing Sheets

POWER SWITCH CIRCUIT SIZING TECHNIQUE

BACKGROUND OF THE INVENTION

1. Field of the Invention

The present invention generally relates to integrated circuits and more particularly to an improved integrated circuit design and method which utilizes voltage islands in application specific integrated circuit (ASIC) designs that make increasing use of power supply switching techniques to control chip power consumption.

2. Description of the Related Art

As technology scales for increased circuit density and performance, the need to reduce power consumption increases in significance as designers strive to utilize the advancing silicon capabilities. The consumer product market further drives the need to minimize chip power consumption.

The total power consumed by conventional CMOS circuitry is composed of two primary sources. The first is active power consumed by circuits as they switch states and either charge or discharge the capacitance associated with the switching nodes. Active power represents the power consumed by the intended work of the circuit to switch signal states and thus execute logic function, This power is not present if the circuit in question is not actively switching. Active power is proportional to the capacitance that is switched, the frequency of operation and to the square of the power supply voltage. Due to technology scaling, the capacitance per unit area increases with each process generation. The power increase represented by this capacitance increase is offset by the scaling of the power supply voltage, Vdd.

The frequency of operation, however, increases with each generation, leading to an overall increase in active power density from technology generation to technology generation. This increasing power density in turn drives the need for more expensive packaging, complex cooling solutions and decreased reliability due to increased temperatures.

Therefore, there is a need for a method and structure that increases performance, while at the same time decreases power consumption. The invention described below satisfies these by providing a solution to the problem of optimum placement of power supply switch circuits.

BRIEF SUMMARY OF THE INVENTION

The invention provides an integrated circuit structure that has at least one voltage island and a pattern of power switches within the voltage island. The pattern determines the number of (and evenly spaces) the power switches according to the size of the serviceable area to which each of the power switches can provide power. The structure has power buses connected to the power switches. The size of the power switches are matched to the current and voltage that will be provided by the power buses. The size of the serviceable area to which each of the power switches can provide power is dependent upon the size of the power switches. Larger power switches have a larger serviceable area than smaller power switches. The number of power switches is equal to the area of the voltage island divided by the size of serviceable area. The structure has logic core areas within the voltage island, where a group of the power switches is positioned along the periphery of logic core areas. The logic core areas have rectangles having a longer pair of sides and a shorter pair of sides. The group of power switches is positioned along the longer sides of the logic core areas.

The invention also provides a method of positioning power switches in a voltage island that matches the size of the power switches to the width of one or more power buses supplying power to the voltage island. The invention determines the size of the serviceable area to which each of the power switches can provide power. The invention divides the voltage island into logic core areas and non-core areas. Next, the invention calculates the number of power switches needed to supply power to the non-core areas of the voltage island. The invention evenly allocates a first group of the power switches across the non-core areas of the voltage island. The invention allocates a second group of the power switches along the periphery of the logic core areas. The matching process matches the size of the power switches to the current and voltage that will be provided by the power buses. The serviceable area is dependent upon the size of the power switches. Larger power switches have a larger serviceable area than smaller power switches. The calculating process includes dividing the non-core area by the size of serviceable area to produce the number of power switches needed. The logic core areas have rectangles that have a longer pair of sides and a shorter pair of sides. The allocating of the second group of power switches positions the second group of power switches along the longer sides of the logic core.

BRIEF DESCRIPTION OF THE SEVERAL VIEWS OF THE DRAWINGS

The invention will be better understood from the following detailed description of preferred embodiments of the invention with reference to the drawings, in which.

DETAILED DESCRIPTION OF THE INVENTION

The power challenges posed by advanced technologies force system designers to make choices concerning devices, structures and voltage levels for the functions they are designing. In previous generations, large functional blocks were not integrated on the same chip, so these choices could be made independently for each block. High levels of integration supported by system-on-a-chip (SoC) enabling technology drive single chip implementations, where traditional approaches to power distribution and performance optimization fail to provide the flexibility of voltage and technology optimization of the previously disintegrated solution.

Newer technologies divide each semiconductor chip into individual functional blocks (voltage islands) as explained in copending U.S. patent application Ser. Nos. 10/065,201 and 10/065,202 both of which are hereby incorporated by reference. These voltage islands of the SoC design can have power characteristics unique from the rest of the design and, with the invention, can be optimized accordingly.

An SoC architecture based on Voltage Islands uses additional design components such as power switches to distribute and manage power. ASIC designs are making increasing use of power supply switching techniques to control, chip power consumption. Thus, power can be conserved by switching off certain voltage islands when they are idle. This invention provides a solution to the problem of optimum placement of such power supply switch circuits.

Figure 1:
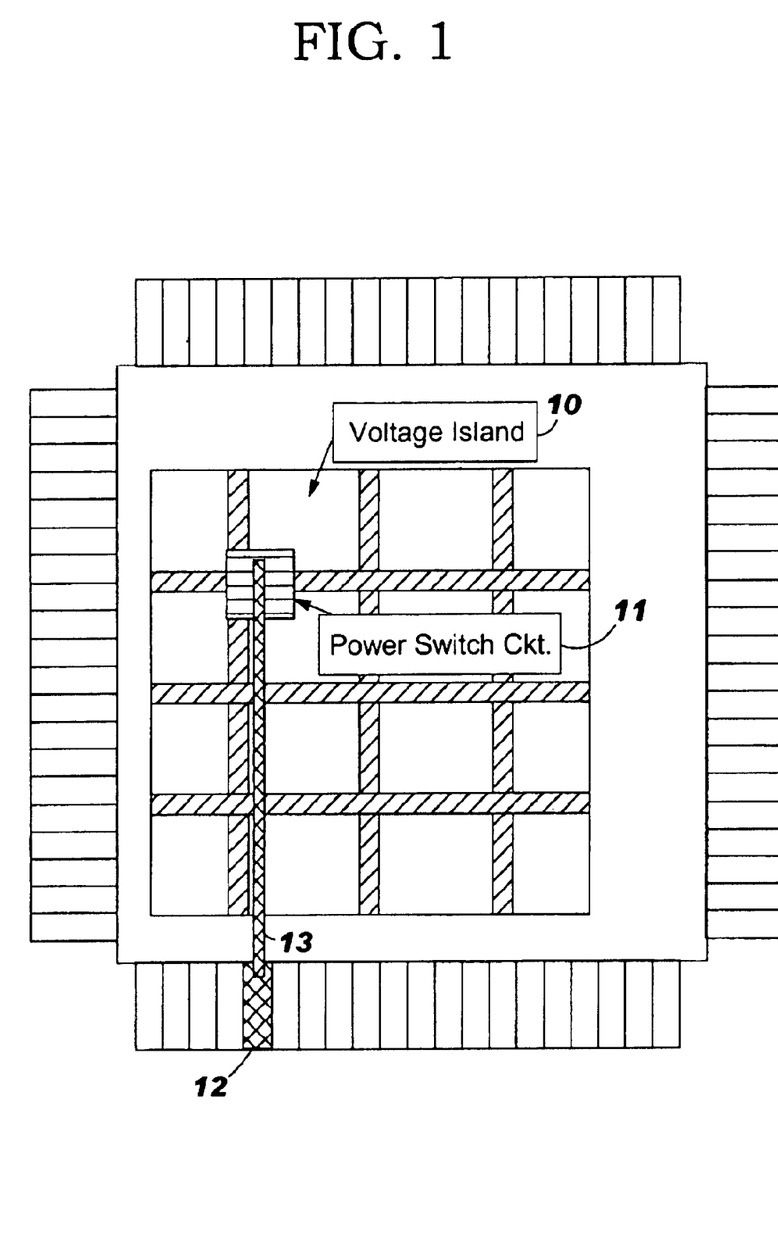
FIG. 1 is an integrated circuit which includes an number of isolated blocks.

More specifically, FIG. 1 shows an integrated circuit which may include a number of isolated blocks, one of which is labeled "Voltage Island" 10. The power supply of the circuitry within the boundary of the box 10 is isolated from the remainder of the chip and controlled by the power switch circuit 11. For ease of description, this particular example describes the island power coming from a single peripheral I/O cell 12, through the power switch 11, then distributed to all cells within the island. However, a single I/O cell 12, connecting wire 13, and power switch cell 11 has limited current capacity. Thus, to fully exploit the advantages of power supply switching, it is better to use multiple power switch circuits in each voltage island. The following describes a technique for determining the quantity of power switch cells required and their placement for varied voltage island content.

Figure 2:
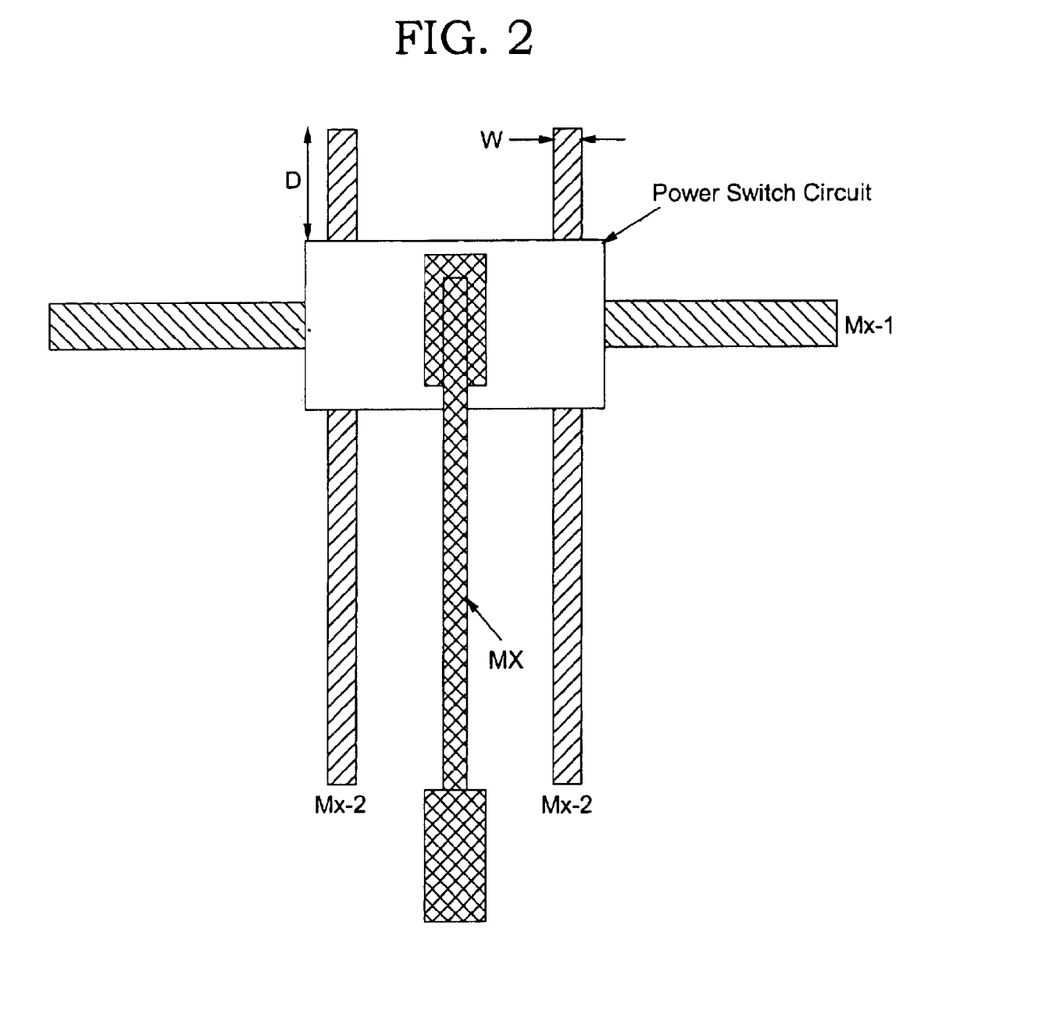
FIG. 2 is a power switch circuit incorporated into the integrated circuit wiring.

FIG. 2 shows a power switch circuit 11 incorporated into integrated circuit wiring. In this example, the highest level of metal shown (Mx) provides unswitched current to the power switch circuit. The power switch 11 supplies switched current to the voltage island via the underlying metal layers, MX-1 and MX-2 in this example. The current capacity of the power switch cell is limited by wire width or the circuit providing the switching function. In either case, each power switch cell has limited current capacity, a portion of which is available on MX-1 and the remainder on MX-2. If the current capacity of the orthogonal metal lines driven by the power switch cell is equivalent, equal current is available on each metal level. If properly designed, current density does not exceed the capacity of the metal wire and voltage drop (voltage drop increases with distance driven) is the limiting factor to how far from the power switch cell a circuit can be driven.

Figure 3:
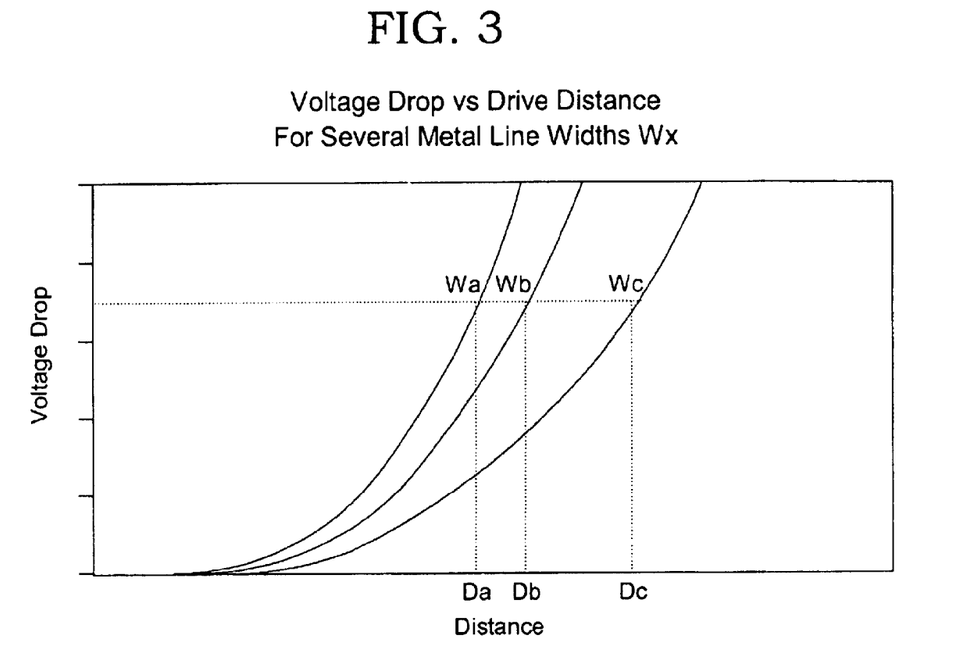
FIG. 3 shows a series of curves that depicts the relationship between voltage drop and maximum drive distance for various width metal lines.

FIG. 3 shows a series of curves depicting the relationship between voltage drop and maximum drive distance for a given load of various width metal lines on a single periodicity (illustrated as Wa, Wb and Wc). Wa is the narrowest line and Wc is the widest line in FIG. 3. The curves represent a particular power pattern and load, but generally voltage drop increases with distance driven. The invention matches the size of the power switch to provide just the current supported by the power bus width available. Thus, by knowing the wiring length, width and load, the current and voltage that will be present on the power buses can be calculated. The size of the power switch within the voltage island is selected to match this current and voltage. Matching the power switch circuit size with the power bus width assures that the minimum area overhead is devoted to power switching circuits.

Figure 4:
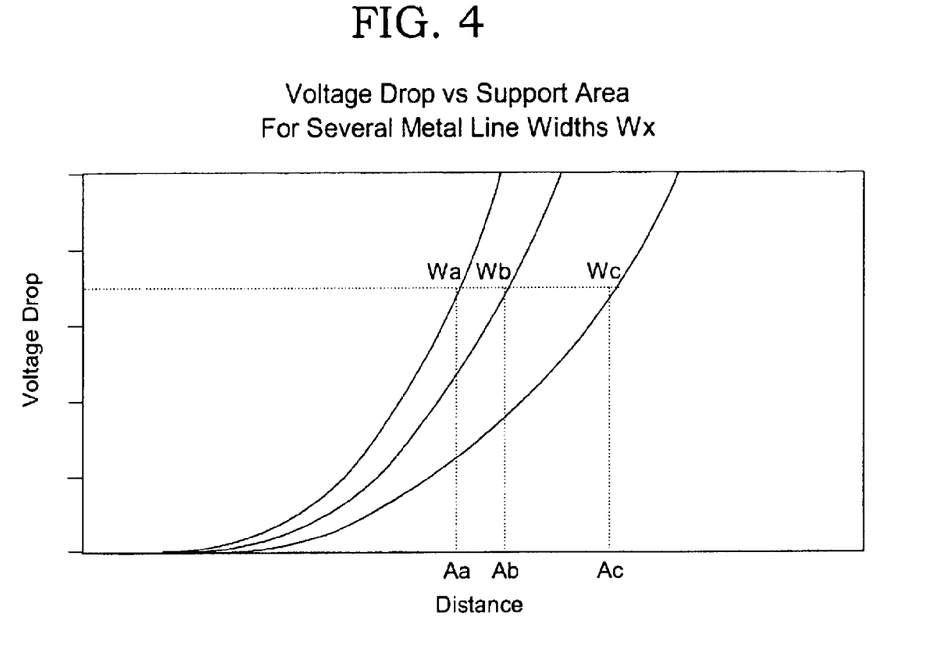
FIG. 4 shows the translation from drive distance to effective area.

The efficient placement of the power switch cells within a voltage island is dependent on the circuitry within the island. The effective support area of a power switch cell is tightly coupled to the design of the power bus It drives. For regular orthogonal power distribution, the effective support area of a power switch can be approximated as a circle of radius equal to the maximum drive distance shown in FIG. 3. FIG. 4 shows the translation from maximum drive distance to effective area. One half the dimension of a side of the effective support area is the effective device distance. The relationship is design dependent related to the number of metal levels available for power distribution and their geometric relationship. The invention is applicable to any design style in which the placement of a power switch circuit can be related to a serviceable area.

Figure 5:
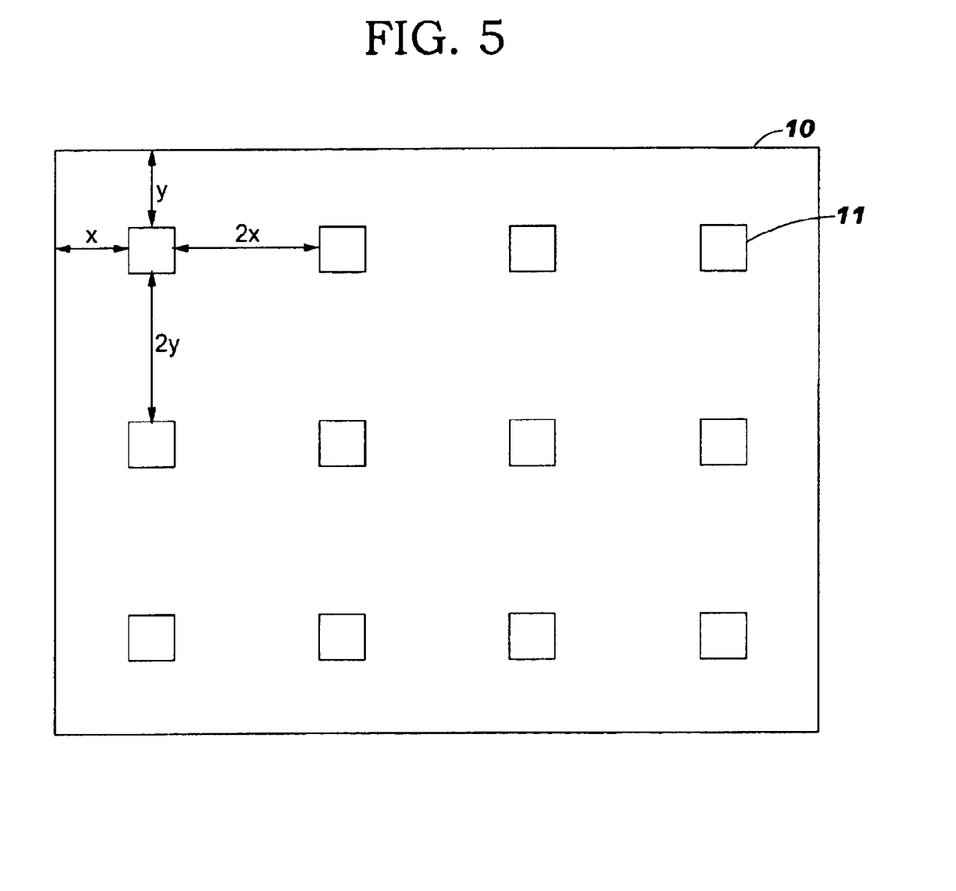
FIG. 5 shows a Voltage Island with Uniform Random Logic Placement.

FIG. 5 shows a Voltage Island with Uniform Random Logic Placement and power consumption. First, the invention determines the current and voltage drop that will occur on the power buses. From this, the invention selects the appropriate size power switch. Next, the invention determines the maximum power switch drive distance for the power bus width and distribution as shown above. The invention then divides the voltage island area by the power switch serviceable area to determine the number of power switch cells needed. The invention evenly distributes the power switch circuits across the voltage island making sure the drive distance does not exceed x or y in FIG. 5 (x and y are the maximum power switch serviceable area for the given power bus width and distribution).

Figure 8:
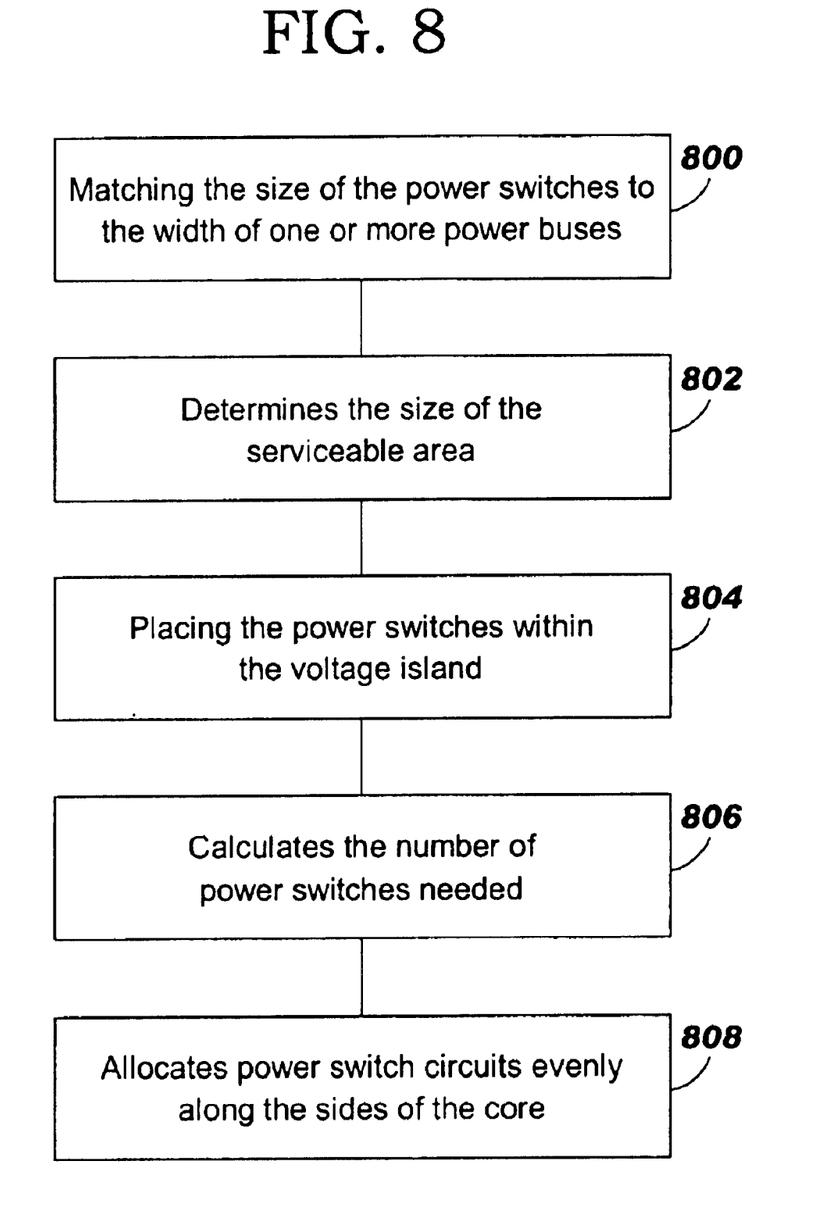
FIG. 8 is a flowchart showing how the invention matches the size of the power switches to the width of one or more power buses.

In other words, as shown in FIG. 8, the invention matches the size of the power switches to the width of one or more power buses supplying power to the voltage island 800. The matching process 800 matches the size of the power switches to the current and voltage that will be provided by the power buses. The invention then determines the size of the serviceable area to which each of the power switches can provide power 802. The serviceable area is dependent upon power bus current, voltage drop, and distribution. Next, the invention places the power switches within the voltage island according to the size of the serviceable area of each of the power switches 804. More specifically, the invention divides the voltage island area by the size of serviceable area to calculate the number of power switches needed.

Figure 6:
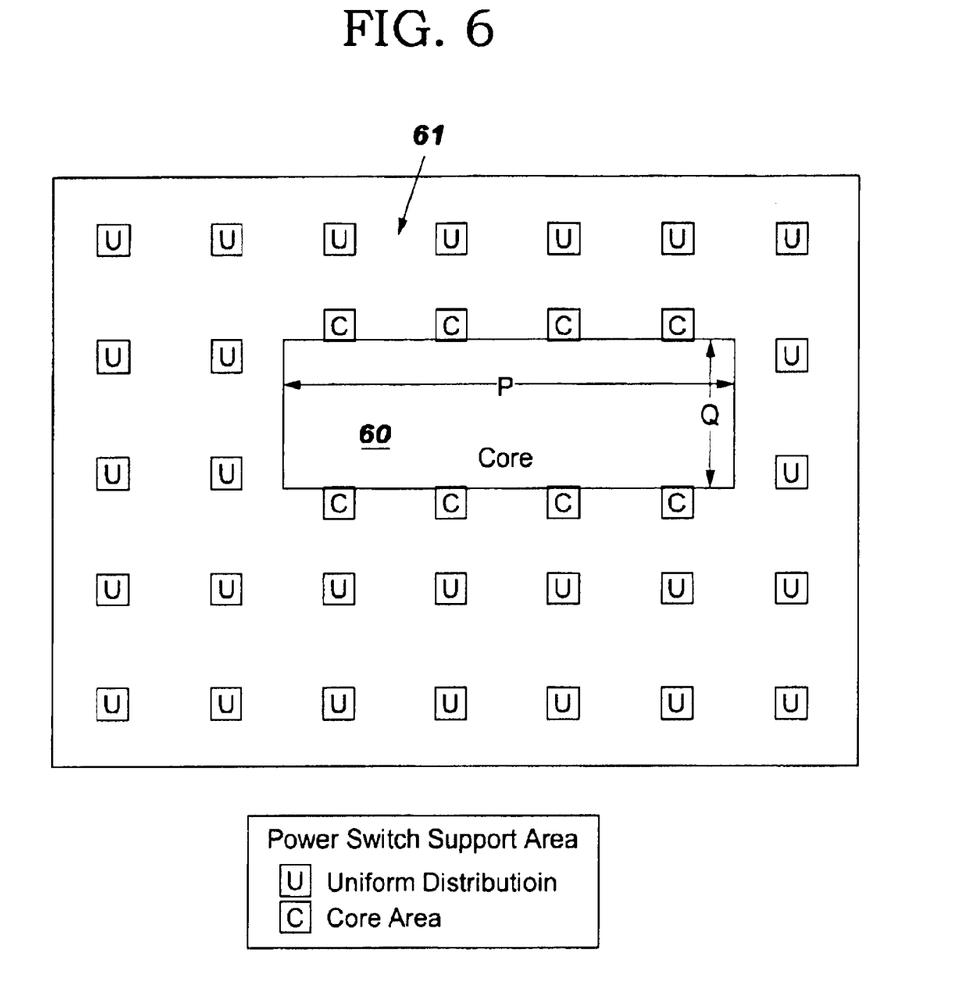
FIGS. 6 and 7 shows the structure which can include a number of logic core areas within the voltage island.

However, uniform power switch placement is not always possible, such as the case of a large core within an island. For example, FIG. 6 shows a voltage island with non-uniform placement having a logic core 60 having dimensions P by Q. First, the invention again determines the voltage drop and the switch size 800. Next, the invention determines the maximum power switch drive distance (e.g. serviceable area) for the voltage island power bus distribution for the non-core portion 61 of the island 802. The area of the logic core(s) 60 is subtracted from the entire voltage island area to calculate the non-core 61 area. The invention then evenly distributes the power switch cells across the non-core area (labeled U in FIG. 6) 804. Again, the invention calculates the serviceable area and the number of power switches needed relative to the logic core 60 area (by dividing the logic core area by the power switch serviceable area) 806. The invention then allocates (positions, distributes, etc.) this number of power switch circuits evenly along the sides of the core 60, as shown in item 808. More specifically, the power switch circuits for the core area C are positioned along the longer sides of the core 60. This minimizes the distance between the power switches to ensure adequate power supply to all areas of the logic core 60.

Figure 7:
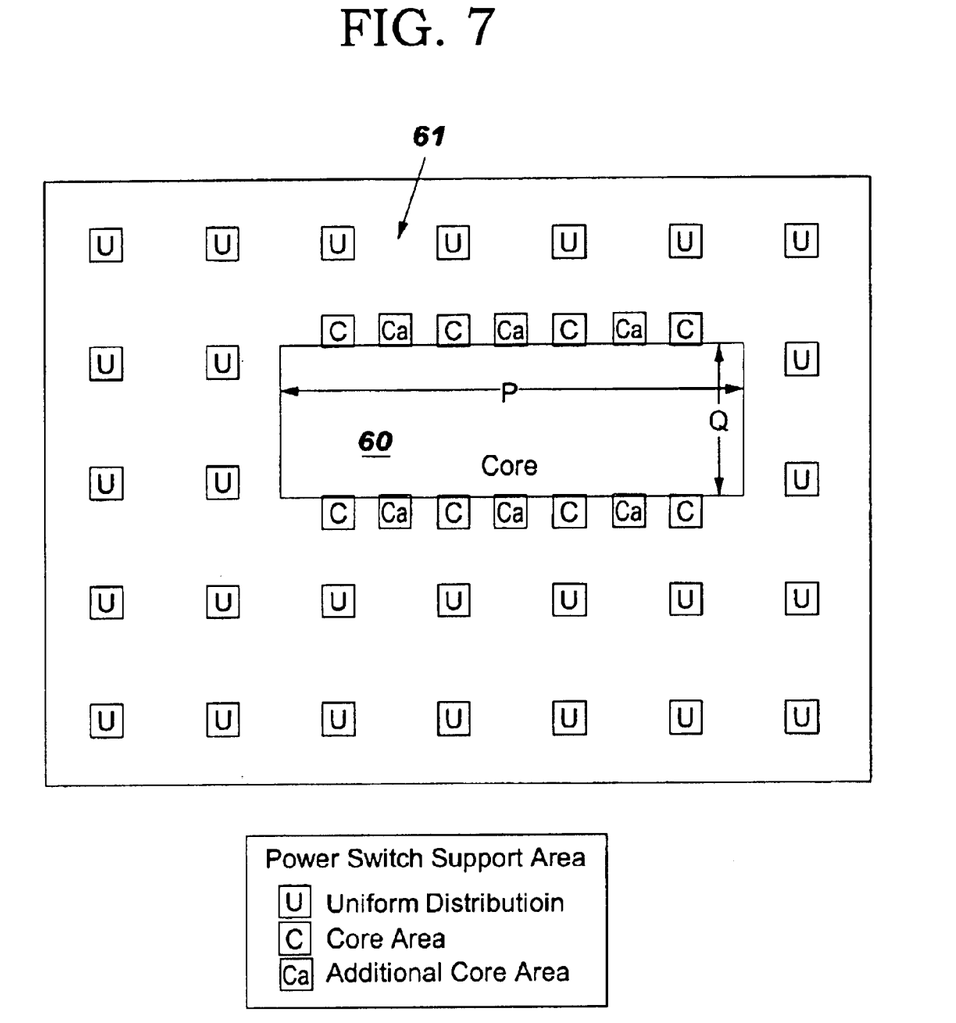

If the shorter core dimension P exceeds twice the effective drive distance or if the distance between the power switches is greater than twice the effective drive distance (2x or 2y), additional power switch cells are added to the extent additional power buses are available. An example of such extra power switches Ca are shown in FIG. 7. The supported drive distance increases by the proportion of additional power switch cells Ca added. Placement of the additional cells is again along the periphery of the longer side of the logic core, as explained above. This technique can be further supplemented by increasing the power bus width within the core area thereby increasing the size of the power switches and the power switch serviceable area.

The invention produces structures shown in FIGS. 5–7 that include at least one voltage island 10 and a pattern of power switches 11 within the voltage island. The pattern 11 balances the power switches according to the size of the serviceable area to which each of the power switches can provide power. Power buses MX-1, MX-2 are connected to the power switches 11. As explained above, the size of the power switches 11 are matched to the current and voltage that will be provided by the power buses MX. The size of the serviceable area to which each of the power switches can provide power is dependent upon the size of the power switches and the power bus width. Thus, larger power switches have a larger serviceable area than smaller power switches. As shown above, the number of power switches is equal to the area of the voltage island divided by the size of serviceable area.

As shown in FIGS. 6 and 7, the structure can include a number of logic core areas (although only one (60) is shown for clarity) within the voltage island. A sub-group of the power switches (C,Ca) is positioned along the periphery of logic core areas. The logic core areas generally comprise rectangles having a longer pair of sides and a shorter pair of sides. The power switches are positioned along the longer sides of the logic core areas to minimize the distance between switches, as explained above.

Thus, as shown above, the invention determines the quantity of power switch cells required and provides a technique for analysis and placement to minimize the number of power switch cells. Placement is driven by power bus design and circuit power consumption.

Further, with the invention, the power switch cells can be distributed unevenly so that different areas (having different power needs) within a given voltage island could be treated separately. Higher densities of power switch cells could be placed in areas of higher power density. This would create an uneven distribution of power switch cells across the voltage island. In the vicinity of cores, placement is along two opposite sides only. In the overall picture, the invention can use several schemes to evenly distribute power switch cells in localized regions of the voltage island to result in an uneven distribution across the voltage island. Therefore, the invention allows each area of the voltage island to be treated according to its specific needs, thereby only utilizing power switch cells where needed. This minimizes the number of power switch cells that are used in the design and also reduces power consumption.

While the invention has been described in terms of preferred embodiments, those skilled in the art will recognize that the invention can be practiced with modification within the spirit and scope of the appended claims. For example, while the foregoing examples illustrate rectangular cores, the shape of the core does not need to be rectangular. To the contrary, any shape of core can be utilized with the invention. For example, for an odd shaped core, the invention can approximate a series of rectangles into the actual shape of the core. One ordinarily skilled in the art would understand that the invention is applicable to many other structures and designs also.

What is claimed is:

1. An integrated circuit structure comprising:
    at least one voltage island; and
    a pattern of power switches within said voltage island, wherein said pattern balances said power switches according to the size of the serviceable area to which each of said power switches can provide power.

2. The structure in claim 1, further comprising power buses connected to said power switches, wherein the size of said power switches are matched to the current and voltage that will be provided by said power buses.

3. The structure in claim 2, wherein the size of the serviceable area to which each of said power switches can provide power is dependent upon said size of said power switches.

4. The structure in claim 3, wherein larger power switches have a larger serviceable area than smaller power switches.

5. The structure in claim 3, wherein the number of power switches is equal to the area of the voltage island divided by said size of serviceable area.

6. The structure in claim 1, further comprising logic core areas within said voltage island, wherein a group of said power switches is positioned along the periphery of logic core areas.

7. The structure in claim 6, wherein said logic core areas comprise rectangles having a longer pair of sides and a shorter pair of sides, and wherein said group of power switches is positioned along the longer sides of said logic core areas.

8. An integrated circuit structure comprising:
    at least one voltage island; and
    a pattern of power switches within said voltage island, wherein said pattern determines the number of, and evenly spaces said power switches according to the size of the serviceable area to which each of said power switches can provide power.

9. The structure in claim 8, further comprising power buses connected to said power switches, wherein the size of said power switches are matched to the current and voltage that will be provided by said power buses.

10. The structure in claim 9, wherein the size of the serviceable area to which each of said power switches can provide power is dependent upon said size of said power switches.

11. The structure in claim 10, wherein larger power switches have a larger serviceable area than smaller power switches.

12. The structure in claim 10, wherein the number of power switches is equal to the area of the voltage island divided by said size of serviceable area.

13. The structure in claim 8, further comprising logic core areas within said voltage island, wherein a group of said power switches is positioned along the periphery of logic core areas.

14. The structure in claim 13, wherein said logic core areas comprise rectangles having a longer pair of sides and a shorter pair of sides, and wherein said group of power switches is positioned along the longer sides of said logic core areas.

15. A method of positioning power switches in a voltage island, said method comprising:
    matching the size of said power switches to the width of one or more power buses supplying power to said voltage island;

determining the size of the serviceable area to which each of said power switches can provide power;

dividing said voltage island into logic core areas and non-core areas;

calculating the number of power switches needed to supply power to said non-core areas of said voltage island;

evenly allocating a first group of said power switches across said noncore areas of said voltage island;

allocating a second group of said power switches along the periphery of said logic core areas.

16. The method in claim 15, wherein said matching process matches said size of said power switches to the current and voltage that will be provided by said power buses.

17. The method in claim 15, wherein said serviceable area is dependent upon said size of said power switches.

18. The method in claim 15, wherein larger power switches have a larger serviceable area than smaller power switches.

19. The method in claim 15, wherein said calculating process includes dividing said non-core area by said size of serviceable area to produce said number of power switches needed.

20. The method in claim 15, wherein said logic core areas comprise rectangles having a longer pair of sides and a shorter pair of sides, and wherein said allocating of said second group of power switches positions said second group of power switches along the longer sides of said logic core.

21. A method of positioning power switches in a voltage island, said method comprising:

matching the size of said power switches to the width of one or more power buses supplying power to said voltage island; and placing said power switches within said voltage island according to the size of the serviceable area of each of said power switches.

22. The method in claim 21, wherein said matching process matches said size of said power switches to the current and voltage that will be provided by said power buses.

23. The method in claim 21, further comprising determining the size of the serviceable area to which each of said power switches can provide power.

24. The method in claim 23, wherein said serviceable area is dependent upon said size of said power switches.

25. The method in claim 23, wherein larger power switches have a larger serviceable area than smaller power switches.

26. The method in claim 23, wherein said calculating process includes dividing said area by said size of serviceable area to produce said number of power switches needed.

27. The method in claim 21, wherein said placing process includes allocating a group of said power switches along the periphery of logic core areas within said voltage island.

28. The method in claim 27, wherein said logic core areas comprise rectangles having a longer pair of sides and a shorter pair of sides, and wherein said allocating of said group of power switches positions said group of power switches along the longer sides of said logic core areas.

29. A method of positioning power switches in a voltage island, said method comprising:

determining the size of the serviceable area to which each of said power switches can provide power;

calculating the number of power switches needed to supply power to the entire area of said voltage island; and evenly allocating said power switches across said area of said voltage island.

30. The method in claim 29, further comprising matching the size of said power switches to the width of one or more power buses supplying power to said voltage island.

31. The method in claim 30, wherein said matching process matches said size of said power switches to the current and voltage that will be provided by said power buses.

32. The method in claim 29, wherein said serviceable area is dependent upon said size of said power switches.

33. The method in claim 29, wherein larger power switches have a larger serviceable area than smaller power switches.

34. The method in claim 29, wherein said calculating process includes dividing said area of said voltage island by said size of serviceable area to produce said number of power switches needed.

35. The method in claim 29, wherein said placing process includes allocating a group of said power switches along the periphery of logic core areas within said voltage island.

36. The method in claim 35, wherein said logic core areas comprise rectangles having a longer pair of sides and a shorter pair of sides, and wherein said allocating of said group of power switches positions said group of power switches along the longer sides of said logic core areas.

* * * * *